United States Patent
Horii et al.

(10) Patent No.: US 8,581,612 B2
(45) Date of Patent: Nov. 12, 2013

(54) PROBE CARD AND TEST APPARATUS INCLUDING THE SAME

(75) Inventors: Hideki Horii, Seoul (KR); Young-kuk Kim, Seoul (KR); Mi-lim Park, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 689 days.

(21) Appl. No.: 12/817,826

(22) Filed: Jun. 17, 2010

(65) Prior Publication Data
US 2011/0121852 A1    May 26, 2011

(30) Foreign Application Priority Data
Nov. 26, 2009  (KR) .................. 10-2009-0115190

(51) Int. Cl.
*G01R 31/20*     (2006.01)
(52) U.S. Cl.
USPC .................................................. 324/754.07
(58) Field of Classification Search
USPC ................ 324/754.07, 750.3, 754.1–754.19, 324/755.01–756.07
See application file for complete search history.

(56) References Cited

U.S. PATENT DOCUMENTS

| | | | |
|---|---|---|---|
| 6,937,040 B2 * | 8/2005 | Maeda et al. ............. | 324/754.07 |
| 6,949,942 B2 * | 9/2005 | Eldridge et al. ......... | 324/754.07 |
| 7,504,841 B2 * | 3/2009 | Frame et al. ............. | 324/755.01 |
| 7,750,652 B2 * | 7/2010 | Campbell ................ | 324/756.06 |
| 7,764,072 B2 * | 7/2010 | Strid et al. ............... | 324/755.01 |
| 7,876,120 B2 * | 1/2011 | Awaji et al. ............. | 324/750.3 |
| 7,978,045 B2 * | 7/2011 | Lee et al. ................ | 337/14 |
| 8,030,956 B2 * | 10/2011 | Otsuga et al. ........... | 324/750.3 |
| 8,138,859 B2 * | 3/2012 | Gritters et al. .......... | 335/78 |
| 8,378,700 B2 * | 2/2013 | Watanabe et al. ....... | 324/754.07 |
| 2006/0284629 A1 * | 12/2006 | Wei et al. ............... | 324/754 |
| 2008/0079450 A1 * | 4/2008 | Dean et al. ............. | 324/754 |
| 2010/0026332 A1 * | 2/2010 | Duerig et al. .......... | 324/758 |
| 2010/0164519 A1 * | 7/2010 | Sellathamby et al. .. | 324/754 |

FOREIGN PATENT DOCUMENTS

| | | |
|---|---|---|
| JP | 08-185762 | 7/1996 |
| JP | 2007-205969 | 8/2007 |
| KR | 1020060017713 | 2/2006 |

* cited by examiner

*Primary Examiner* — Joshua Benitez-Rosario
(74) *Attorney, Agent, or Firm* — F. Chau & Associates, LLC

(57) ABSTRACT

A probe card and a test apparatus including the probe card for improving test reliability. The probe card may include a first input terminal Microelectromechanical Systems (MEMS) switch that connects a first input terminal and a first input probe pin, wherein the first input terminal MEMS switch comprises a control portion that receives an operation signal and a connection portion that connects the first input terminal and the first input probe pin. The probe card may further include a first output terminal MEMS switch that connects a first output terminal and a first output probe pin, wherein the first output terminal MEMS switch comprises a control portion that receives the operation signal and a connection portion that connects the first output terminal and the first output probe pin.

15 Claims, 10 Drawing Sheets

PROBE CARD AND TEST APPARATUS INCLUDING THE SAME

CROSS-REFERENCE TO RELATED APPLICATIONS

This application claims the benefit of Korean Patent Application No. 10-2009-0115190, filed on Nov. 26, 2009, in the Korean Intellectual Property Office, the disclosure of which is incorporated by reference herein in its entirety.

BACKGROUND

The inventive concept relates to a probe card and a test apparatus including the probe card, and more particularly, to a probe card and a test apparatus including the probe card having a Microelectromechanical Systems (MEMS) switch.

After semiconductor devices are formed on a wafer via a semiconductor fabrication process, an electrical characteristic test is performed on each of the semiconductor devices to test for defects. The electrical characteristic test is performed by a probe card that applies an electrical signal to the semiconductor devices on the wafer, senses a signal transmitted from the applied electrical signal, and determines the presence of any defects. Conventional probe card typically utilize a mechanical switch to apply an electrical signal to the semiconductor devices. The voltage generated by the mechanical switch when performing a switching operation may cause damage to the semiconductor devices, deteriorating measurement reliability.

SUMMARY

According to an exemplary embodiment of the inventive concept, a probe card may include a first input terminal Microelectromechanical Systems (MEMS) switch that connects a first input terminal and a first input probe pin, wherein the first input terminal MEMS switch comprises a control portion that receives an operation signal and a connection portion that connects the first input terminal and the first input probe pin. The exemplary embodiment may further comprise a first output terminal MEMS switch that connects a first output terminal and a first output probe pin, wherein the first output terminal MEMS switch comprises a control portion that receives an operation signal and a connection portion that connects the first output terminal and the first output probe pin.

A distance between the first input probe pin and the first input terminal MEMS switch and a distance between the first output probe pin and the first output terminal MEMS switch may be no greater than about 50 cm.

The control portion of the first input terminal MEMS switch and the control portion of the first output terminal MEMS switch may be configured to receive a same operation signal.

The probe card may further include a first input probe MEMS switch that connects the first input terminal MEMS switch and the first input probe bin, and a first output probe MEMS switch that connects the first output terminal MEMS switch and the first output probe pin.

The probe card may further include a second input terminal MEMS switch that connects a second input terminal and a second input probe pin, wherein the second input terminal MEMS switch comprises a control portion that receives the operation signal and a connection portion that connects the second input terminal and the second input probe pin, and a second output terminal MEMS switch that connects a second output terminal and a second output probe pin, wherein the second output terminal MEMS switch comprises a control portion that receives the operation signal and a connection portion that connects the second output terminal and the second output probe pin, wherein the first input terminal is a pulse input terminal that receives a pulse input signal, the second input terminal is a direct current (DC) input terminal that receives a DC input signal, the first output terminal is a pulse output terminal that transmits a pulse output signal, and the second output terminal is a DC output terminal that transmits a DC output signal.

The probe card may further include a first transmission line that connects the control portion of the first input terminal MEMS switch and the control portion of the first output terminal MEMS switch, and a second transmission line that connects the control portion of the second input terminal MEMS switch and the control portion of the second output terminal MEMS switch, wherein an operation signal transmitted via the first and second transmission lines performs one of, simultaneously turning on the first input and output terminal MEMS switches and turning off the second input and output terminal MEMS switches, or simultaneously turning on the second input and output terminal MEMS switches and turning off the first input and output terminal MEMS switches.

The probe card may further include a power source switch, connected to the first and second transmission lines, that transmits the operation signal to one of the first or second transmission lines.

The power source switch may be a demultiplexer that transmits the operation signal to one of the first or second transmission lines according to a clock signal.

According to another exemplary embodiment of the inventive concept, a probe card may comprise a plurality of input terminals configured to receive a plurality of input signals, a plurality of input probe pins configured to transmit the plurality of input signals to a plurality of input pads of a wafer, and a plurality of Microelectromechanical Systems (MEMS) switches that connect the plurality of input terminals and a plurality of input probe MEMS switches, wherein, each of the plurality of input terminal MEMS switches comprises a control portion that receives an operation signal and a connection portion that connects the plurality of input terminals and the plurality of input probe MEMS switches, and each of the plurality of input probe MEMS switches comprises a control portion that receives the operation signal and a connection portion that connects the plurality of input terminal MEMS switches and the plurality of input probe pins.

The probe card may further include a plurality of output terminals configured to transmit a plurality of output signals, a plurality of output probe pins configured to receive the plurality of output signals from a plurality of output pads of the wafer, and a plurality of output terminal MEMS switches that connect the plurality of output terminals and the plurality of output probe pins, wherein each of the plurality of output terminal MEMS switches comprises a control portion that receives the operation signal and a connection portion that connects the plurality of output terminals and the plurality of output probe pins.

The probe card may further include a plurality of transmission lines configured to connect each control portion of the plurality of input terminal MEMS switches and each control portion of the plurality of output terminal MEMS switches, wherein each of the plurality of transmission lines simultaneously transmits the operation signal to each control portion of the plurality of input terminal MEMS switches and each control portion of the plurality of output terminal MEMS switches.

The probe card may further include a plurality of output terminals configured to transmit a plurality of output signals, a plurality of output probe pins configured to receive the plurality of output signals from a plurality of output pads of the wafer, and a plurality of output terminal MEMS switches that connect the plurality of output terminals and a plurality of output probe MEMS switches, wherein each of the plurality of output terminal MEMS switches comprises a control portion that receives an operation signal and a connection portion that connects the plurality of output terminals and the plurality of output probe MEMS switches, and each of the plurality of output probe MEMS switches comprises a control portion that receives an operation signal and a connection portion that connects the plurality of output terminal MEMS switches and the plurality of output probe pins.

The probe card may further include a plurality of probe transmission lines configured to connect each control portion of the plurality of input probe MEMS switches and each control portion of the plurality of output probe MEMS switches, wherein each of the plurality of probe transmission lines simultaneously transmits the operation signal to each control portion of the plurality of input probe MEMS switches and each control portion of the plurality of output probe MEMS switches.

The probe card may further include a plurality of transmission lines configured to connect each control portion of the plurality of input terminal MEMS switches and each control portion of the plurality of output terminal MEMS switches, wherein each of the plurality of transmission lines simultaneously transmits an operation signal to each control portion of the plurality of input terminal MEMS switches and each control portion of the plurality of output terminal MEMS switches.

According to another exemplary embodiment of the inventive concept, a test apparatus includes a probe card, and the probe card includes a first input terminal Microelectromechanical Systems (MEMS) switch that connects a first input terminal and a first input probe pin, a first output terminal MEMS switch that connects a first output terminal and a first output probe pin, a second input terminal MEMS switch that connects a second input terminal and a second input probe pin, and a second output terminal MEMS switch that connects a second output terminal and a second output probe pin.

The test apparatus may further include a pulse generator configured to apply a pulse input signal to the first input terminal, a source measuring unit (SMU) configured to apply a direct current (DC) input signal to the second input terminal, an oscilloscope configured to receive a pulse output signal from the first output terminal, and a ground connection configured to receive a DC output signal from the second output terminal.

The test apparatus may further include a first power source configured to simultaneously apply a first operation signal to a control portion of the first input terminal MEMS switch and a control portion of the first output terminal MEMS switch, a second power source configured to simultaneously apply a second operation signal to a control portion of the second input terminal MEMS switch and a control portion of the second output terminal MEMS switch, and a power source controller configured to control the first and second power sources, wherein the first input and output terminal MEMS switches are turned on while the second input and output terminal MEMS switches are off, and the second input and output terminal MEMS switches are turned on while the first input and output terminal MEMS switches are off.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
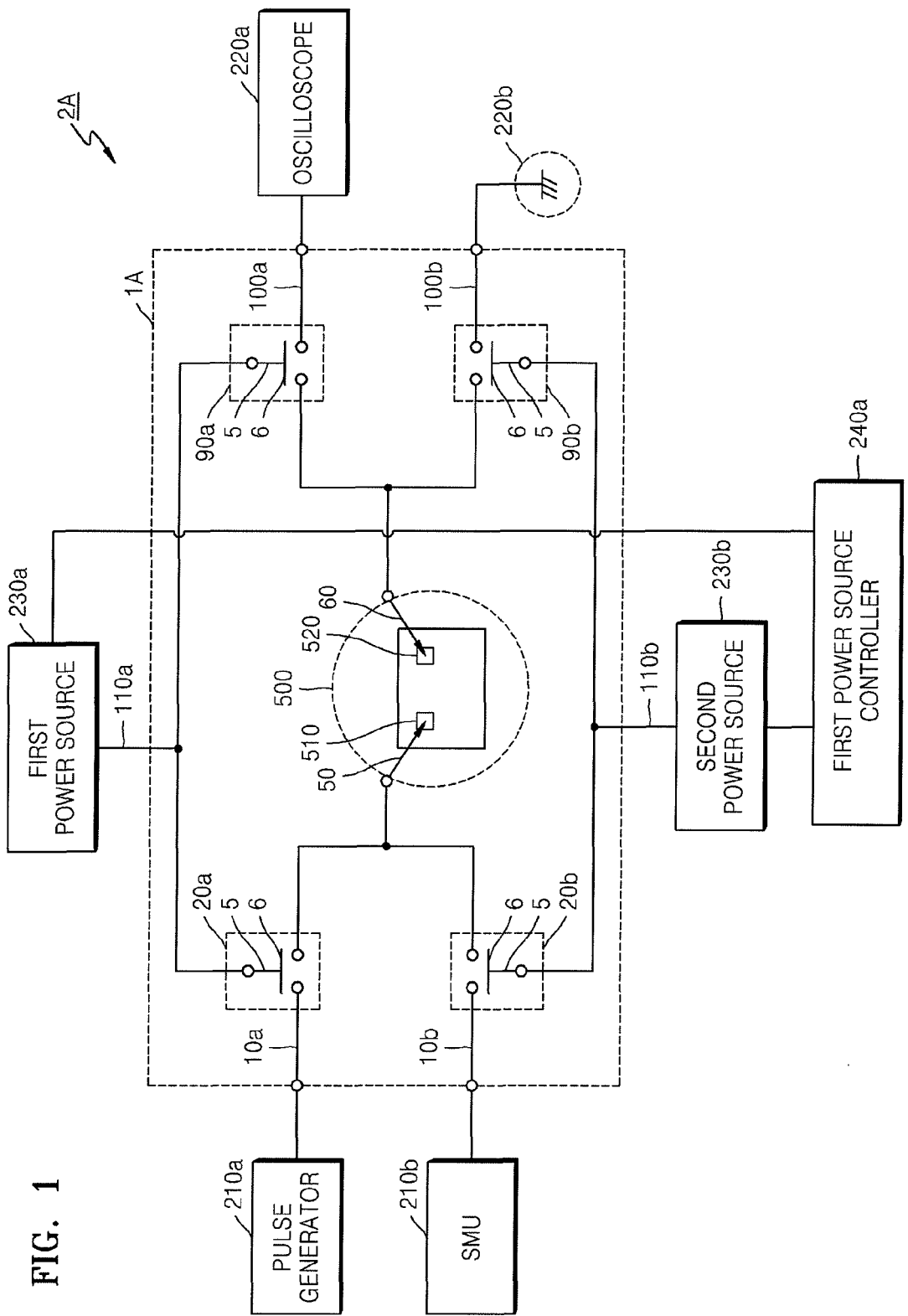
FIG. 1 is a diagram of a probe card and a test apparatus including the probe card according to an exemplary embodiment of the inventive concept.

Exemplary embodiments of the inventive concept are described more fully hereinafter with reference to the accompanying drawings. The inventive concept may, however, be embodied in many different forms and should not be construed as being limited to the exemplary embodiments set forth herein.

Furthermore, all examples and conditional language recited herein are to be construed as being without limitation to such specifically recited examples and conditions. Throughout the specification, a singular form may include plural forms. Terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components and parts, the components and parts are not limited to the terms "first" and "second." The terms "first" and "second" are used only to distinguish between each of the components and parts. Thus, a first component or part may indicate a second component or part.

Hereinafter, the inventive concept will be described in detail by explaining exemplary embodiments of the inventive concept with reference to the attached drawings. With respect to the drawings, shapes in the drawings may be revised according to a manufacturing technology and/or a tolerance. Therefore, the attached drawings for illustrating exemplary embodiments of the inventive concept are referred to in order to gain a sufficient understanding of the inventive concept, the merits thereof, and the objectives accomplished by the implementation of the inventive concept. Like numbers refer to like elements throughout the drawings.

FIG. 1 is a diagram of a probe card 1A and a test apparatus 2A including the probe card 1A according to an exemplary embodiment of the inventive concept.

Referring to FIG. 1, the probe card 1A may include first and second input terminals 10a and 10b, first and second input terminal Microelectromechanical Systems (MEMS) switches 20a and 20b, an input probe pin 50, an output probe pin 60, first and second output terminal MEMS switches 90a and 90b, first and second output terminals 100a and 100b, and first and second transmission lines 110a and 110b. The input probe pin 50, the output probe pin 60, the first and second input terminal MEMS switches 20a and 20b, and the first and second output terminal MEMS switches 90a and 90b may be located within the probe card 1A. However, the location of these devices is not limited thereto, and thus, the input probe pin 50, the output probe pin 60, the first and second input terminal MEMS switches 20a and 20b, and the first and second output terminal MEMS switches 90a and 90b may be located within other probe cards (not shown).

For illustrative purposes, exemplary embodiments described herein comprise two input terminals, two input terminal MEMS switches, two output terminal MEMS switches, and two output terminals, however, the number of these units is not limited thereto, as will be appreciated by those skilled in the art.

The first and second input terminals 10a and 10b may receive a single input signal or may receive separate input signals, respectively, as shown in the exemplary embodiment in FIG. 1. For example, the first input terminal 10a may receive a first input signal, and the second input terminal 10b may receive a second input signal. In an exemplary embodiment, the first input terminal 10a may be a pulse input terminal and the first input signal may be a pulse input signal, and the second input terminal 10b may be a direct current (DC) input terminal and the second input signal may be a DC input signal. However, the first and second input terminals 10a and 10b and the first and second input signals are not limited thereto. The first and second input signals may be input to the first and second input terminals 10a and 10b.

The first input terminal MEMS switch 20a may be positioned between the first input terminal 10a and the input probe pin 50, and the second input terminal MEMS switch 20b may be positioned between the second input terminal 10b and the input probe pin 50. The first and second input terminal MEMS switches 20a and 20b may electrically connect the first input terminal 10a and the input probe pin 50, and the second input terminal 10b and the input probe pin 50, respectively. The first and second input terminal MEMS switches 20a and 20b may include a control portion 5 for receiving an operation signal, and a connection portion 6 for electrically connecting the first and second input terminals 10a and 10b to the input probe pin 50.

The input probe pin 50 may comprise a first end electrically connected to the first input terminal MEMS switch 20a and a second end electrically connected to the second input terminal MEMS switch 20b. The first and second ends are further electrically connected to an input pad 510 of a wafer 500. The number of ends on the input probe pin 50 may be varied based on the number of input terminal MEMS switches present, according to different embodiments of the inventive concept. The input probe pin 50 may receive the first and second input signals from the first and second input terminals 10a and 10b, and may transmit the received first and second input signals to the input pad 510 of the wafer 500. The distances between the input probe pin 50 and the first and second input terminal MEMS switches 20a and 20b may be, for example, about 0.1-50 cm, but the distance is not limited thereto.

The first and second output terminals 100a and 100b may transmit a single output signal or may transmit separate output signals, respectively, as shown in the exemplary embodiment in FIG. 1. For example, the first output terminal 100a may transmit a first output signal, and the second output terminal 100b may transmit a second output signal. In an exemplary embodiment, the first output terminal 100a may be a pulse output terminal and the first output signal may be a pulse output signal, and the second output terminal 100b may be a DC output terminal and the second output signal may be a DC output signal. However, the first and second output terminals 100a and 100b and the first and second output signals are not limited thereto.

The first output terminal MEMS switch 90a may be positioned between the first output terminal 100a and the output probe pin 60, and the second output terminal MEMS switch 90b may be positioned between the second output terminal 100b and the output probe pin 60. The first and second output terminal MEMS switches 90a and 90b may electrically connect the first output terminal 100a and the output probe pin 60, and the second output terminal 100b and the output probe pin 60, respectively. The first and second output terminal MEMS switches 90a and 90b may include a control portion 5 for receiving an operation signal, and a connection portion 6 for electrically connecting the first and second output terminals 100a and 100b to the output probe pin 60.

The output probe pin 60 may comprise a first end electrically connected to the first output terminal MEMS switch 90a and a second end electrically connected to the second output terminal MEMS switch 90b. The first and second ends are further electrically connected to an output pad 520 of a wafer 500. The number of ends on the output probe pin 60 may be varied based on the number of output terminal MEMS switches present, according to different embodiments of the inventive concept. The output probe pin 60 may receive an output signal from the output pad 520, and may transmit the received output signal to the first and second output terminals 100a and 100b, respectively. The distance between the output probe pin 60 and the first and second output terminal MEMS switches 90a and 90b may be, for example, about 0.1-50 cm, but the distance is not limited thereto.

As illustrated in FIG. 1, the first and second transmission lines 110a and 110b may be electrically connected to the control portion 5 of the first and second input terminal MEMS switches 20a and 20b, and the control portion 5 of the first and second output terminal MEMS switches 90a and 90b, respectively. In an exemplary embodiment, the control portion 5 of the first and second input terminal MEMS switches 20a and 20b, and the control portion 5 of the first and second output terminal MEMS switches 90a and 90b may receive the same operation signal. As a result, an operation signal may simultaneously turn on/off the first input terminal MEMS switch 20a and the first output terminal MEMS switch 90a, and the second input terminal MEMS switch 20b and the second output terminal MEMS switch 90b, respectively.

For example, the control portion 5 of the first input terminal MEMS switch 20a and the control portion 5 of the first output terminal MEMS switch 90a may be electrically connected, for example, via the first transmission line 110a. The first transmission line 110a may simultaneously transmit the operation signal to the control portion 5 of the first input terminal MEMS switch 20a and the control portion 5 of the first output terminal MEMS switch 90a. As a result, the first input terminal MEMS switch 20a and the first output terminal MEMS switch 90a may be simultaneously turned on or simultaneously turned off.

Similarly, the control portion 5 of the second input terminal MEMS switch 20b and the control portion 5 of the second output terminal MEMS switch 90b may be electrically connected, for example, via the second transmission line 110b. The second transmission line 110b may simultaneously transmit the operation signal to the control portion 5 of the second input terminal MEMS switch 20b and the control portion 5 of the second output terminal MEMS switch 90b. As a result, the second input terminal MEMS switch 20b and the second output terminal MEMS switch 90b may be simultaneously turned on or simultaneously turned off.

According to the exemplary embodiment illustrated in FIG. 1, the test apparatus 2A may include the probe card 1A, and may further include first and second input signal applying units 210a and 210b, first and second output signal receiving units 220a and 220b, first and second power sources 230a and 230b, and a first power source controller 240a.

The first input signal applying unit 210a may apply the first input signal to the first input terminal 10a, and the second input signal applying unit 210b may apply the second input signal to the second input terminal 10b. The first input signal applying unit 210a may be, for example, a pulse generator, and the first input terminal 10a may be, for example, a pulse input terminal. The second input signal applying unit 210b may be, for example, a source measuring unit (SMU), and the second input terminal 10b may be, for example, a DC input terminal. The first input signal may be, for example, a pulse input signal, and the second input signal may be, for example, a DC input signal. In an exemplary embodiment, the first input signal applying unit 210a may be electrically connected to the pulse input terminal 10a in the probe card 1A, and may apply the pulse input signal to the pulse input terminal 10a. The SMU 210b may be electrically connected to the DC input terminal 10b in the probe card 1A, and may apply the DC input signal to the DC input terminal 10b. Although the input signal applying units 210a and 210b comprise a pulse generator and a SMU, respectively, in the exemplary embodiment, the input signal applying units 210a and 210b are not limited thereto.

The first output signal receiving unit 220a may receive the first output signal from the first output terminal 100a, and the second output signal receiving unit 220b may receive the second output signal from the second output terminal 100b. The first output signal receiving unit 220a may be, for example, an oscilloscope, and the first output terminal 100a may be, for example, a pulse output terminal. The second output signal receiving unit 220b may be, for example, a ground connection, and the second output terminal 100b may be, for example, a DC output terminal. The first output signal may be, for example, the pulse output signal, and the second output signal may be, for example, the DC output signal. In an exemplary embodiment, the oscilloscope 220a may be electrically connected to the pulse output terminal 100a in the probe card 1A, and may receive the pulse output signal transmitted from the pulse output terminal 100a. The ground 220b may be electrically connected to the DC output terminal 100b in the probe card 1A, and may receive the DC output signal transmitted from the DC output terminal 100b. Although the first and second output signal receiving units 220a and 220b comprise an oscilloscope and a ground connection, respectively, in the exemplary embodiment, the output signal receiving units 220a and 220b are not limited thereto.

In an exemplary embodiment, the first and second power sources 230a and 230b may simultaneously apply an operation signal to the control portion 5 of the first and second input terminal MEMS switches 20a and 20b, and the control portion 5 of the first and second output terminal MEMS switches 90a and 90b. For example, the first and second power sources 230a and 230b may be electrically connected to the first and second transmission lines 110a and 110b in the probe card 1A. As a result, the first and second power sources 230a and 230b may simultaneously apply the operation signal to the control portion 5 of the first and second input terminal MEMS switches 20a and 20b, and the control portion 5 of the first and second output terminal MEMS switches 90a and 90b.

For example, the first power source 230a may be electrically connected to the first transmission line 110a, and may simultaneously apply a first operation signal to the control portion 5 of the first input terminal MEMS switch 20a and the control portion 5 of the first output terminal MEMS switch 90a. As a result, the first input terminal MEMS switch 20a and the first output terminal MEMS switch 90a may be simultaneously turned on or simultaneously turned off.

Similarly, the second power source 230b may be electrically connected to the second transmission line 110b, and may simultaneously apply a second operation signal to the control portion 5 of the second input terminal MEMS switch 20b, and the control portion 5 of the second output terminal MEMS switch 90b. As a result, the second input terminal MEMS switch 20b and the second output terminal MEMS switch 90b may be simultaneously turned on or simultaneously turned off.

The first power source controller 240a may be electrically connected to the first and second power sources 230a and 230b and may control the first and second power sources 230a and 230b to be operated in an alternate manner. For example, the first power source controller 240a may cause the first input terminal MEMS switch 20a and the first output terminal MEMS switch 90a to be simultaneously turned on by the first power source 230a, and the second input terminal MEMS switch 20b and the second output terminal MEMS switch 90b to be simultaneously turned off by the second power source 230b. Similarly, the first power source controller 240a may cause the second input terminal MEMS switch 20b and the second output terminal MEMS switch 90b to be simultaneously turned on by the second power source 230b, and the first input terminal MEMS switch 20a and the first output terminal MEMS switch 90a to be simultaneously turned off by the first power source 230a.

Figure 2:
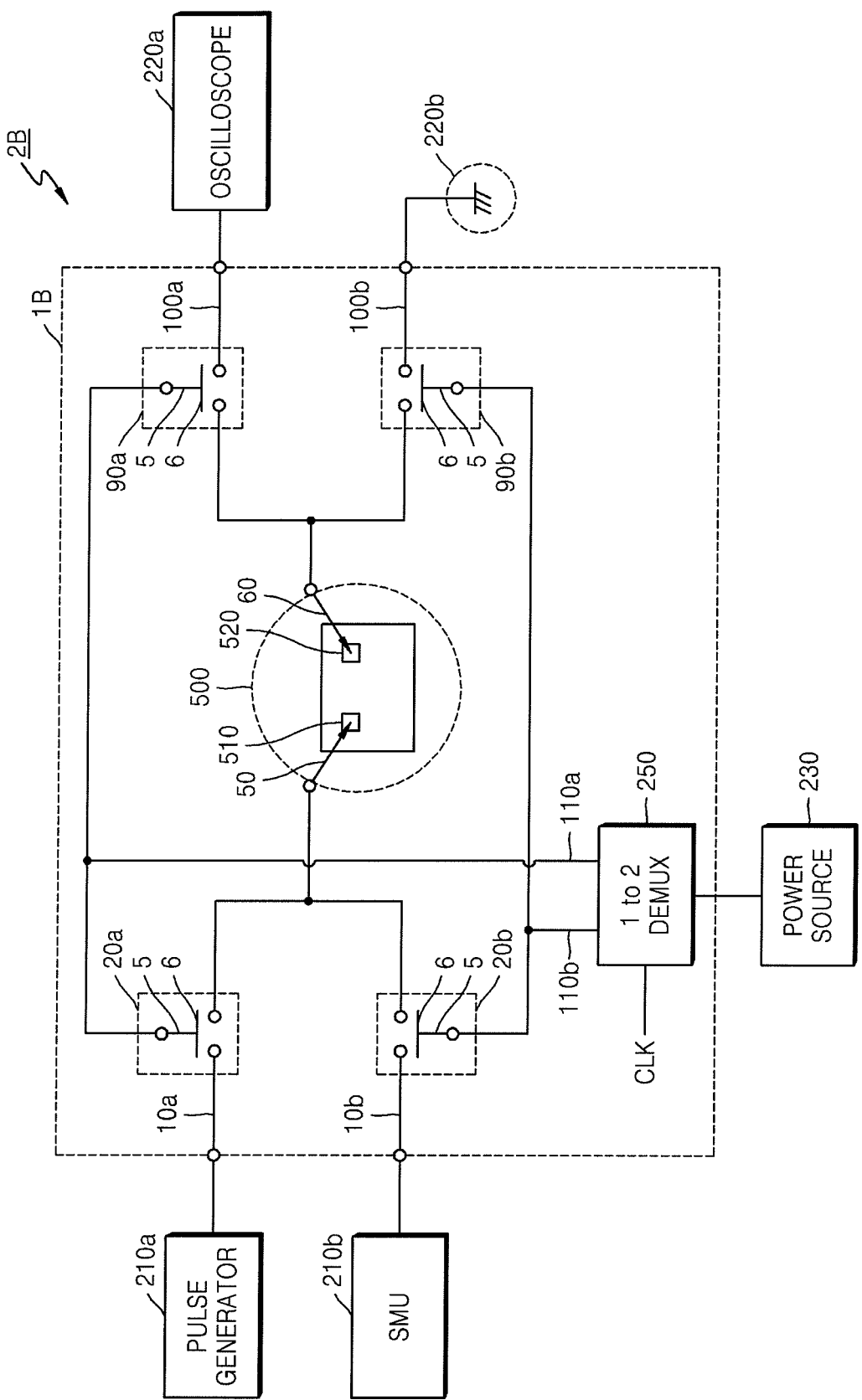
FIG. 2 is a diagram of a probe card and a test apparatus including the probe card according to another exemplary embodiment of the inventive concept.

FIG. 2 is a diagram of a probe card 1B and a test apparatus 2B including the probe card 1B according to another exemplary embodiment of the inventive concept. The probe card 1B and the test apparatus 2B according to the present exemplary embodiment may comprise a revised embodiment of the probe card 1A and the test apparatus 2A according to the exemplary embodiment illustrated in FIG. 1. Thus, hereinafter, the same descriptions thereof are omitted here.

Referring to FIG. 2, the probe card 1B may further include a power source switch 250. The power source switch 250 may be connected to first and second transmission lines 110a and 110b, and a power source 230. The power source switch 250 may be connected to the power source 230 and may transmit an operation signal from the power source 230 to one of the first and second transmission lines 110a and 110b. In the exemplary embodiment illustrated in FIG. 2, the power source switch 250 is located within the probe card 1B, however, the location of the power source switch 250 is not limited thereto.

In an exemplary embodiment, the power source switch 250 may be embodied as a demultiplexer. The demultiplexer 250 may receive an operation signal from the power source 230, and may transmit the operation signal to one of the first and second transmission lines 110a and 110b based on a clock signal CLK. For example, when the clock signal CLK received by the demultiplexer 250 indicates '1' or 'high,' the operation signal may be applied to the first transmission line 110a, and when the clock signal CLK received by the demultiplexer 250 indicates '0' or 'low,' the operation signal may be applied to the second transmission line 110b. Although the power source switch 250 comprises a demultiplexer in the exemplary embodiment, the power source switch 250 is not limited thereto.

Figure 3:
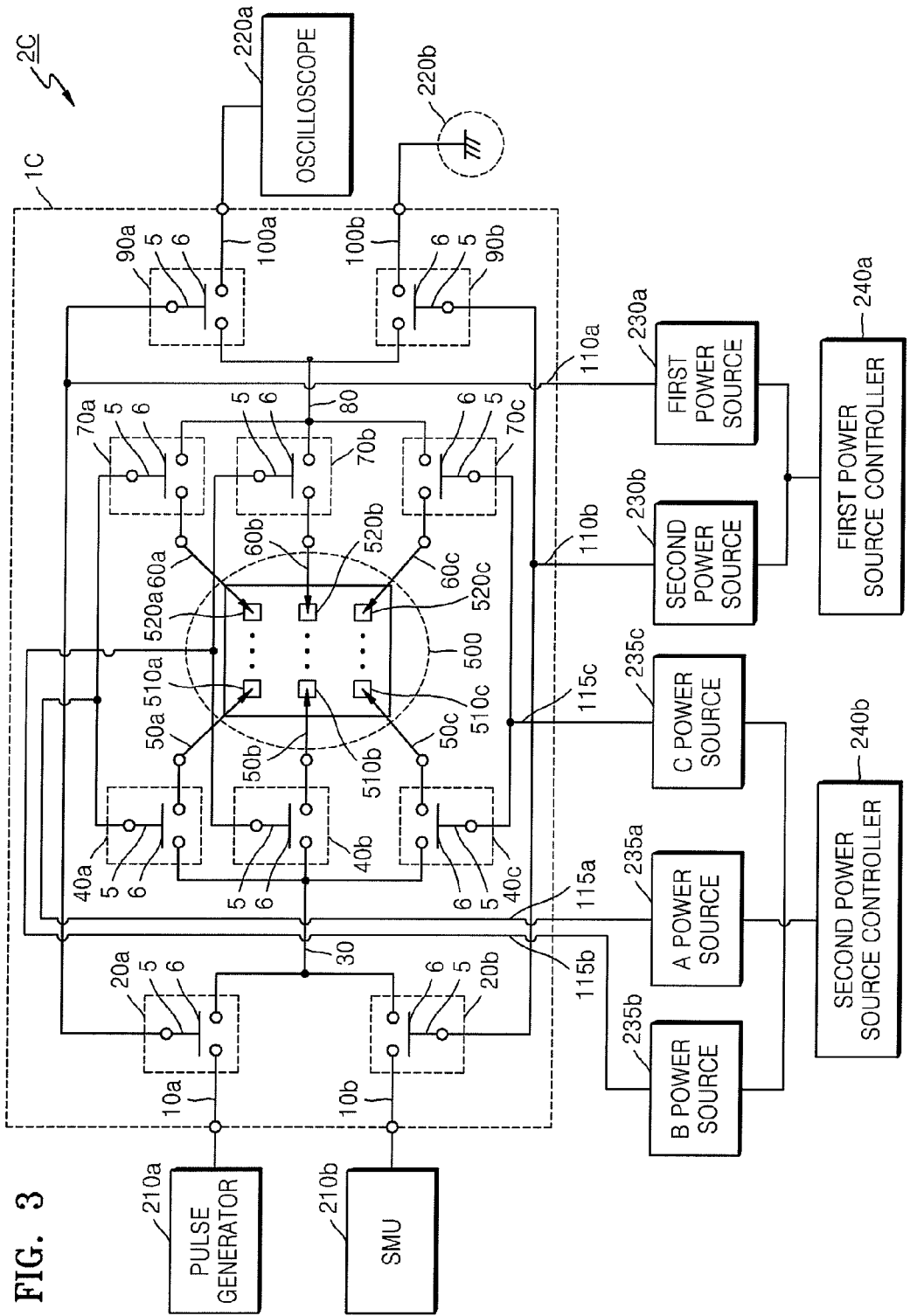
FIG. 3 is a diagram of a probe card and a test apparatus including the probe card according to another exemplary embodiment of the inventive concept.

FIG. 3 is a diagram of a probe card 1C and a test apparatus 2C including the probe card 1C according to another exemplary embodiment of the inventive concept. The probe card 1C and the test apparatus 2C according to the present exemplary embodiment may comprise a revised embodiment of the probe card 1A and the test apparatus 2A according to the exemplary embodiment illustrated in FIG. 1. Thus, hereinafter, the same descriptions thereof are omitted here.

Referring to FIG. 3, the probe card 1C may include first and second input terminals 10a and 10b, first and second input terminal MEMS switches 20a and 20b, a first connection node 30, first through third input probe MEMS switches 40a, 40b, and 40c, first through third input probe pins 50a, 50b, and 50c, first through third output probe pins 60a, 60b, and 60c, first through third output probe MEMS switches 70a, 70b, and 70c, a second connection node 80, first and second output terminal MEMS switches 90a and 90b, first and second output terminals 100a and 100b, first and second transmission lines 110a and 110b, and A through C probe transmission lines 115a, 115b, and 115c. The first and second input terminal MEMS switches 20a and 20b, the first and second output terminal MEMS switches 90a and 90b, the first through third input probe pins 50a, 50b, and 50c, the first through third output probe pins 60a, 60b, and 60c, the first through third input probe MEMS switches 40a, 40b, and 40c, and the first through third output probe MEMS switches 70a, 70b, and 70c may be located within probe card 1A or within other probe cards (not shown).

For illustrative purposes, exemplary embodiments described herein comprise two input terminals, two input terminal MEMS switches, two output terminal MEMS switches, and two output terminals, however, the number of these units is not limited thereto, as will be appreciated by those skilled in the art. Similarly, exemplary embodiments described herein comprise three input probe MEMS switches, three input probe pins, three input pads, three output pads, three output probe pins, and three output probe MEMS switches, however, the number of these units is not limited thereto, as will be appreciated by those skilled in the art.

The first and second input terminals 10a and 10b may receive a single input signal, or the first input terminal 10a may receive a first input signal, and the second input terminal 10b may receive a second input signal, as illustrated in FIG. 3. In an exemplary embodiment, the first input terminal 10a may be, for example, a pulse input terminal, and the first input signal may be, for example, a pulse input signal, however, the first input terminal 10a and the first input signal are not limited thereto. The second input terminal 10b may be, for example, a DC input terminal, and the second input signal may be, for example a DC input signal, however, the second input terminal 10b and the second input signal are not limited thereto. The first and second input signals that may be input to the first and second input terminals 10a and 10b.

The first and second input terminal MEMS switches 20a and 20b may be positioned between the first and second input terminals 10a and 10b, and the first connection node 30, respectively. For example, the first input terminal MEMS switch 20a may be positioned between the first input terminal 10a and the first connection node 30, and the second input terminal MEMS switch 20b may be positioned between the second input terminal 10b and the first connection node 30. The distance between the first and second input terminal MEMS switches 20a and 20b, and the first through third input probe pins 50a, 50b, and 50c may be, for example, about 0.1-50 cm, respectively, but the distance is not limited thereto. The first and second input terminal MEMS switches 20a and 20b may include a control portion 5 for receiving an operation signal, and a connection portion 6 for electrically connecting the first and second input terminals 10a and 10b, and the first connection node 30.

The first through third input probe pins 50a, 50b, and 50c may comprise two ends, each of which are electrically connected to the first through third input probe MEMS switches 40a, 40b, and 40c, respectively. The two ends are further electrically connected to first through third input pads 510a, 510b, and 510c of a wafer 500, respectively.

The first through third input probe MEMS switches 40a, 40b, and 40c may be positioned between the first through third input probe pins 50a, 50b, and 50c, and the first connection node 30, respectively. The distance between the first through third input probe MEMS switches 40a, 40b, and 40c, and the first through third input probe pins 50a, 50b, and 50c may be, for example, about 0.1-50 cm, respectively, but the distance is not limited thereto.

The first through third input probe MEMS switches 40a, 40b, and 40c may include a control portion 5 for receiving an operation signal, and a connection portion 6 for electrically connecting the first through third input pads 510a, 510b, and 510c, and the first connection node 30.

The first and second output terminals 100a and 100b may transmit an output signal. For example, the first output terminal 100a may transmit a first output signal, and the second output signal 100b may transmit a second output signal. In an exemplary embodiment, the first output terminal 100a may be, for example, a pulse output terminal, and the first output signal may be, for example, a pulse output signal, however the first output terminal 100a and the first output signal are not limited thereto. The second output terminal 100b may be, for example, a DC output terminal, and the second output signal may be, for example, a DC output signal, however the second output terminal 100b and the second output signal are not limited thereto. The first and second output signals may be input to the first and second output terminals 100a and 100b.

The first and second output terminal MEMS switches 90a and 90b may be positioned between the first and second output terminals 100a and 100b, and the second connection node 80, respectively. For example, the first output terminal MEMS switch 90a may be positioned between the first output terminal 100a and the second connection node 80, and the second output terminal MEMS switch 90b may be positioned between the second output terminal 100b and the second connection node 80. The distance between the first and second output terminal MEMS switches 90a and 90b, and the first through third output probe pins 60a, 60b, and 60c may be, for example, about 0.1-50 cm, respectively, but the distance is not limited thereto. The first and second output terminal MEMS switches 90a and 90b may include a control portion 5 for receiving an operation signal, and a connection portion 6 for electrically connecting the first and second output terminals 100a and 100b, and the second connection node 80.

The first through third output probe pins 60a, 60b, and 60c may comprise two ends, one end being electrically connected to the first through third output probe MEMS switches 70a, 70b, and 70c, and the other end being electrically connected to first through third output pads 520a, 520b, and 520c of the wafer 500, respectively.

The first through third output probe MEMS switches 70a, 70b, and 70c may be positioned between the first through third output probe pins 60a, 60b, and 60c, and the second connection node 80, respectively. The distance between the first through third output probe MEMS switches 70a, 70b, and 70c, and the first through third output probe pins 60a, 60b, and 60c may be, for example, about 0.1-50 cm, respectively, but the distance is not limited thereto. The first through third output probe MEMS switches 70a, 70b, and 70c may include a control portion 5 for receiving an operation signal, and a connection portion 6 for electrically connecting the first through third output pads 520a, 520b, and 520c, and the second connection node 80.

The first and second transmission lines 110a and 110b may be electrically connected to the control portion 5 of the first and second input terminal MEMS switches 20a and 20b, and the control portion 5 of the first and second output terminal MEMS switches 90a and 90b, respectively. For example, the first transmission line 110a may be electrically connected to the first input terminal MEMS switch 20a and the first output terminal MEMS switch 90a, and the second transmission line 110b may be electrically connected to the second input terminal MEMS switch 20b and the second output terminal MEMS switch 90b.

The A through C probe transmission lines 115a, 115b, and 115c may be electrically connected to the control portion 5 of the first through third input probe MEMS switches 40a, 40b, and 40c, and the control portion 5 of the first through third output probe MEMS switches 70a, 70b, and 70c, respectively. For example, the A probe transmission line 115a may be electrically connected to the control portion 5 of the first input probe MEMS switch 40a and the control portion 5 of the first output probe MEMS switch 70a, the B probe transmission line 115b may be electrically connected to the control portion 5 of the second input probe MEMS switch 40b and the control portion 5 of the second output probe MEMS switch 70b, and the C probe transmission line 115c may be electrically connected to the control portion 5 of the third input probe MEMS switch 40c and the control portion 5 of the third output probe MEMS switch 70c.

According to the exemplary embodiment illustrated in FIG. 3, the test apparatus 2C may include the probe card 1C, and may further include first and second input signal applying units 210a and 210b, first and second output signal receiving units 220a and 220b, first and second power sources 230a and 230b, A through C power sources 235a, 235b, and 235c, and first and second power source controllers 240a and 240b.

The first and second input signal applying units 210a and 210b may apply input signals to the first and second input terminals 10a and 10b. The first input signal applying unit 210a may be, for example, a pulse generator, and the second input signal applying unit 210b may be, for example, a SMU, however, the first input signal applying unit 210a and the second input signal applying unit 210b are not limited thereto. In the exemplary embodiment illustrated in FIG. 3, the pulse generator 210a may apply a pulse input signal to the pulse input terminal 10a, and the SMU 210b may apply a DC input signal to the DC input terminal 10b.

The first and second output signal receiving units 220a and 220b may receive output signals from the first and second output terminals 100a and 100b. For example, the first output signal receiving unit 220a may be, for example, an oscilloscope, and the second output signal receiving unit 220b may be, for example, a ground connection, however, the first output signal receiving unit 22a and the second output signal receiving unit 220b are not limited thereto. In the exemplary embodiment illustrated in FIG. 3, the oscilloscope 220a may receive a pulse output signal from the pulse output terminal 100a, and the ground connection 220b may receive a DC output signal from the DC output terminal 100b.

The first and second power sources 230a and 230b may be electrically connected to the first and second transmission lines 110a and 110b, and may apply an operation signal to the control portion 5 of the first and second input terminal MEMS switches 20a and 20b, and to the control portion 5 of the first and second output terminal MEMS switches 90a and 90b, respectively. For example, the first power source 230a may apply the operation signal to the control portion 5 of the first input terminal MEMS switch 20a and to the control portion 5 of the first output terminal MEMS switch 90a via the first transmission line 110a. Similarly, the second power source 230b may apply the operation signal to the control portion 5 of the second input terminal MEMS switch 20b and to the control portion 5 of the second output terminal MEMS switch 90b via the second transmission line 110b.

The A through C power sources 235a, 235b, and 235c may be electrically connected to the A through C probe transmission lines 115a, 115b, and 115c, and may apply an operation signal to the control portion 5 of the first through third input probe MEMS switches 40a, 40b, and 40c, and to the control portion 5 of the first through third output probe MEMS switches 70a, 70b, and 70c, respectively. For example, the A power source 235a may apply the operation signal to the control portion 5 of the first input probe MEMS switch 40a and to the control portion 5 of the first output probe MEMS switch 70a via the A probe transmission line 115a, the B power source 235b may apply the operation signal to the control portion 5 of the second input probe MEMS switch 40b and to the control portion 5 of the second output probe MEMS switch 70b via the B probe transmission line 115b, and the C power source 235c may apply the operation signal to the control portion 5 of the third input probe MEMS switch 40c and to the control portion 5 of the third output probe MEMS switch 70c via the C probe transmission line 115c.

The first power source controller 240a may be electrically connected to the first and second power sources 230a and 230b and may control the first and second power sources 230a and 230b to be operated in an alternate manner. For example, the first power source controller 240a may cause the first input terminal MEMS switch 20a and the first output terminal MEMS switch 90a to be simultaneously turned on by the first power source 230a, and the second input terminal MEMS switch 20b and the second output terminal MEMS switch 90b to be simultaneously turned off by the second power source 230b. Similarly, the first power source controller 240a may cause the second input terminal MEMS switch 20b and the second output terminal MEMS switch 90b to be simultaneously turned on by the second power source 230b, and the first input terminal MEMS switch 20a and the first output terminal MEMS switch 90a to be simultaneously turned off by the first power source 230a.

The second power source controller 240b may be electrically connected to the A through C power sources 235a, 235b, and 235c. The second power source controller 240b may control the A through C power sources 235a, 235b, and 235c to be operated in an alternate manner. For example, when the first input probe MEMS switch 40a and the first output probe MEMS switch 70a are simultaneously turned on, the second and third input probe MEMS switches 40b and 40c and the second and third output probe MEMS switches 70b and 70c may be simultaneously turned off. Similarly, when the second input probe MEMS switch 40b and the second output probe MEMS switch 70b are simultaneously turned on, the first and third input probe MEMS switches 40a and 40c and the first and third output probe MEMS switches 70a and 70c may be simultaneously turned off. Similarly, when the third input probe MEMS switch 40c and the third output probe MEMS switch 70c are simultaneously turned on, the first and second input probe MEMS switches 40a and 40b and the first and second output probe MEMS switches 70a and 70b may be simultaneously turned off.

Although not illustrated in FIG. 3, a first power source switch, as illustrated in FIG. 2 (250), may be located within the probe card 1C or the test apparatus 2C. The first power source switch allows the operation signal to be alternately applied to the first and second transmission lines 110a and 110b via one power source rather than two power sources, e.g., the first and second power sources 230a and 230b shown in FIG. 3. The first power source switch may comprise a first demultiplexer (e.g., 1 to log2N demultiplexers). Similarly, a second power source switch (not shown) may be located within the probe card 1C or the test apparatus 2C, allowing the operation signal to be alternately applied to the A through C probe transmission lines 115a, 115b, and 115c via one power source, rather than three power sources, e.g., the A through C power sources 235a, 235b, and 235c shown in FIG. 3. as the second power source switch may comprise a second demultiplexer (e.g., 1 to log2M demultiplexers).

Figure 4:
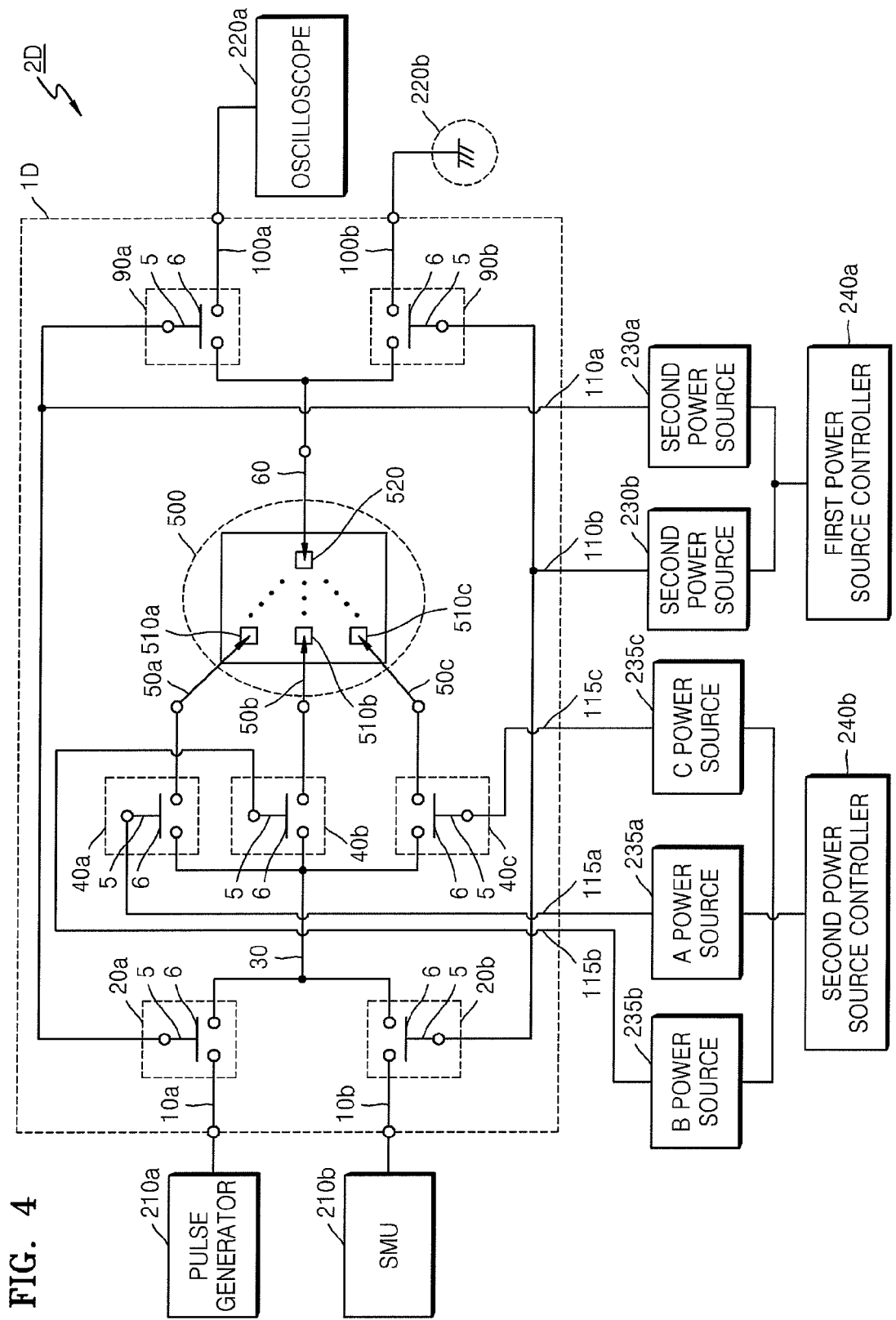
FIG. 4 is a diagram of a probe card and a test apparatus including the probe card according to another exemplary embodiment of the inventive concept.

FIG. 4 is a diagram of a probe card 1D and a test apparatus 2D including the probe card 1D according to another exemplary embodiment of the inventive concept. The probe card 1D and the test apparatus 2D according to the present exemplary embodiment may comprise a revised embodiment of the probe card 1C and the test apparatus 2C according to the exemplary embodiment illustrated in FIG. 3. Thus, hereinafter, the same descriptions thereof are omitted here.

Referring to FIG. 4, a wafer 500 may comprise, for example, first through third input pads 510a, 510b, and 510c, and a common output pad 520, however, the number of input pads and output pads is not limited thereto. A probe card 1D may comprise first through third input probes 50a, 50b, and 50c, and output probe 60, however, the number of input probes and output probes is not limited thereto. The output probe pin 60 may comprise two ends, each of which being electrically connected to first and second output terminal MEMS switches 90a and 90b, and being electrically connected to the common output pad 520 of the wafer 500, respectively.

A through C probe transmission lines 115a, 115b, and 115c may be electrically connected to the control portion 5 of the first through third input probe MEMS switches 40a, 40b, and 40c, respectively. For example, the A probe transmission line 115a may be electrically connected to the control portion 5 of the first input probe MEMS switch 40a, the B probe transmission line 115b may be electrically connected to the control portion 5 of the second input probe MEMS switch 40b, and the C probe transmission line 115c may be electrically connected to the control portion 5 of the third input probe MEMS switch 40c.

A through C power sources 235a, 235b, and 235c may be electrically connected to the A through C probe transmission lines 115a, 115b, and 115c, and may apply an operation signal to the control portions 5 of the first through third input probe MEMS switches 40a, 40b, and 40c, respectively. For example, the A power source 235a may apply the operation signal to the control portion 5 of the first input probe MEMS switch 40a via the A probe transmission line 115a, the B power source 235b may apply the operation signal to the control portion 5 of the second input probe MEMS switch 40b via the B probe transmission line 115b, and the C power source 235c may apply the operation signal to the control portion 5 of the third input probe MEMS switch 40c via the C probe transmission line 115c.

A second power source controller 240b may be electrically connected to the A through C power sources 235a, 235b, and 235c. The second power source controller 240b may control the A through C power sources 235a, 235b, and 235c to be operated in an alternate manner. For example, when the first input probe MEMS switch 40a is turned on, the second and third input probe MEMS switches 40b and 40c may be turned off. Similarly, when the second input probe MEMS switch 40b is turned on, the first and third input probe MEMS switches 40a and 40c may be turned off. Also, when the third input probe MEMS switch 40c is turned on, the first and second input probe MEMS switches 40a and 40b may be turned off.

Figure 5:
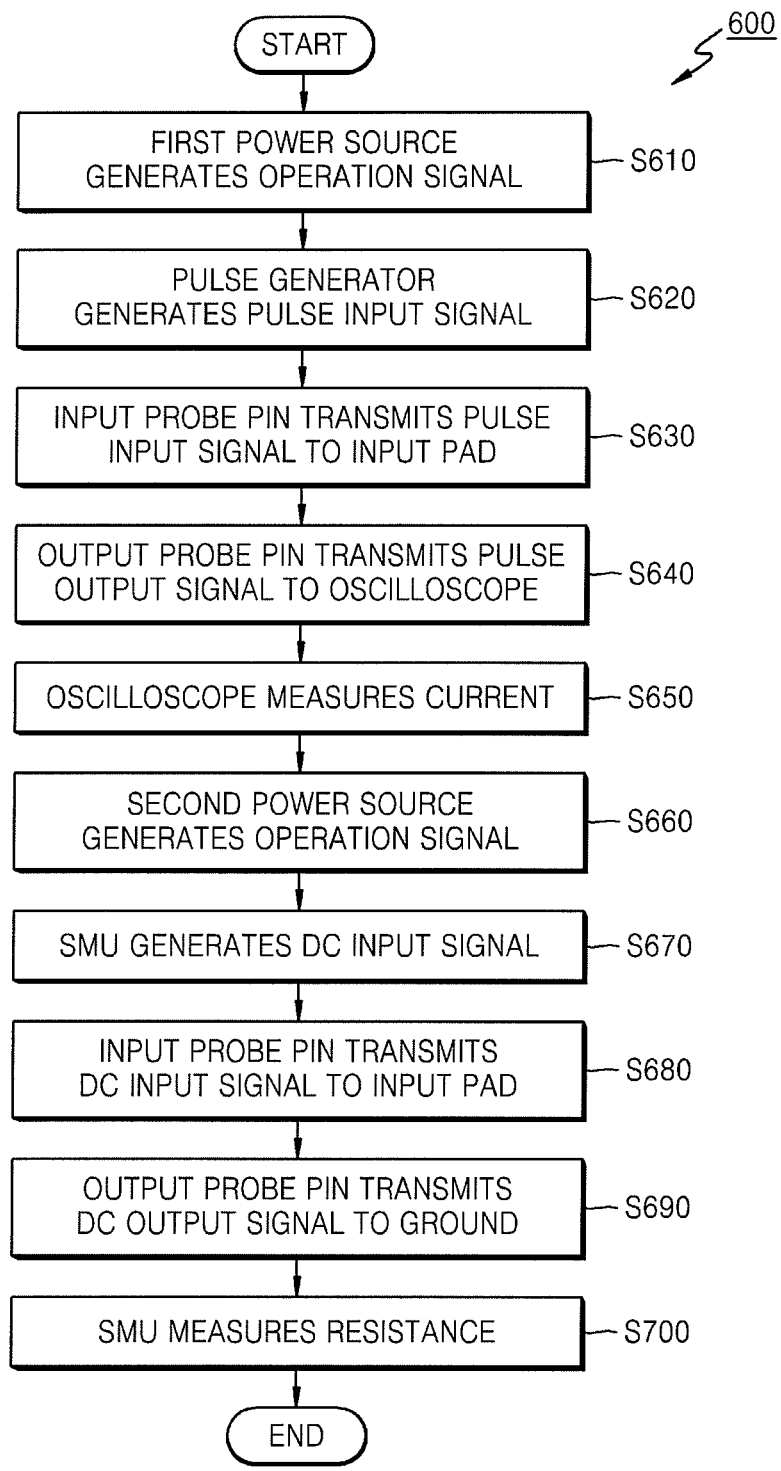
FIG. 5 is a flowchart of a method for testing a semiconductor device using a test apparatus including a probe card, according to an exemplary embodiment of the inventive concept.

FIG. 5 is a flowchart illustrating a method 600 for testing a resistive semiconductor device using the test apparatus 2A including the probe card 1A, according to an exemplary embodiment of the inventive concept.

Referring to FIGS. 1 and 5, the first power source controller 240a of the test apparatus 2A controls the first power source 230a, causing it to generate an operation signal (S610). The operation signal is applied to the first transmission line 110a, causing the first input terminal MEMS switch 20a and the first output terminal MEMS switch 90a to be simultaneously turned on. Because an operation signal of the second power source 230b is not generated by the first power source controller 240a, the second input terminal MEMS switch 20b and the second output terminal MEMS switch 90b remain turned off. The pulse generator 210a generates a pulse input signal (S620). The input probe pin 50 transmits the pulse input signal to the input pad 510 of the wafer 500 (S630). The pulse input signal is transformed into a pulse output signal by a semiconductor device (not shown) in the wafer 500, and is transmitted to the output pad 520 of the wafer 500. The output probe pin 60, which is electrically connected to the output pad 520, transmits the pulse output signal to the oscilloscope 220a (S640). The oscilloscope 220a measures a current based on the pulse input signal and the pulse output signal (S650).

The first power source controller 240a controls the second power source 230b, causing it to generate an operation signal (S660). The operation signal is applied to the second transmission line 110b, causing the second input terminal MEMS switch 20b and the second output terminal MEMS switch 90b to be simultaneously turned on. Because an operation signal of the first power source 230a is not generated by the first power source controller 240a, the first input terminal MEMS switch 20a and the first output terminal MEMS switch 90a remain turned off. The SMU 210b generates a DC input signal (S670). The input probe pin 50 transmits the DC input signal to the input pad 510 of the wafer 500 (S680). The DC input signal is transformed into a DC output signal by the semiconductor device (not shown) in the wafer 500, and is transmitted to the output pad 520. The output probe pin 60, which is electrically connected to the output pad 520, transmits the DC output signal to the ground connection 220b (S690). The SMU 210b measures resistance of the semiconductor device based on the DC input signal and the DC output signal (S700).

Figure 6:
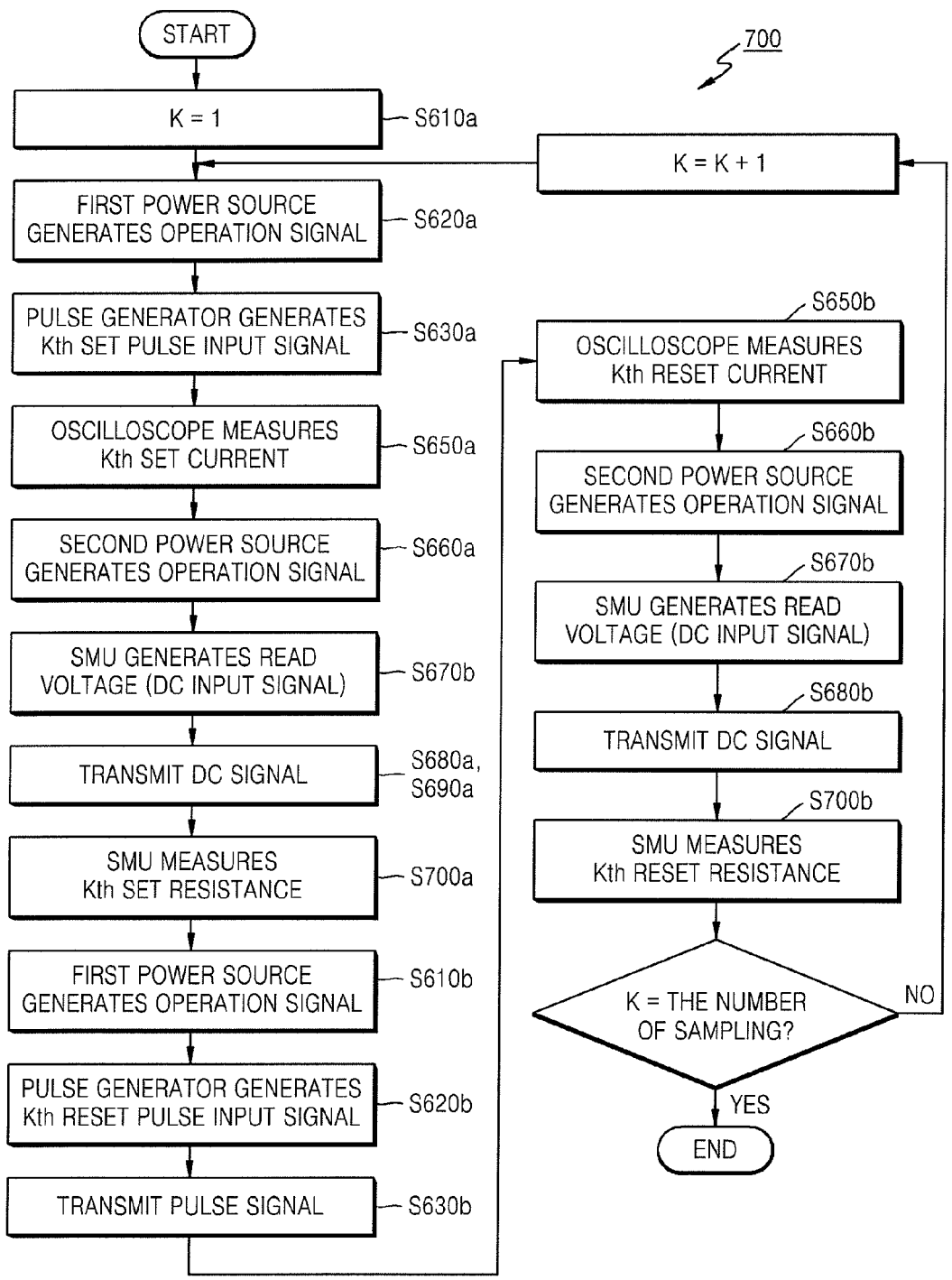
FIG. 6 is a flowchart of a method for testing a semiconductor device using a test apparatus including a probe card, according to another exemplary embodiment of the inventive concept.

FIG. 6 is a flowchart illustrating a method 700 for testing a semiconductor device using a test apparatus including a probe card, according to another exemplary embodiment of the inventive concept. The present embodiment describes method 600 of FIG. 5 in more detail.

Method 600, described with reference to FIG. 5, relates to a method for testing a semiconductor device by applying a pulse signal and a DC signal to the device and measuring the resulting current and resistance characteristics of the device. Method 700, described with reference to FIG. 6, relates to a detailed method for testing a semiconductor device by measuring a SET current and SET resistance after a SET process of the device, and a RESET current and RESET resistance after a RESET process of the device.

Referring to FIGS. 1, 5 and 6, a semiconductor device is tested by measuring current and resistance characteristics of the semiconductor device relative to a high frequency signal. The method 600 may include measurement of current and resistance characteristics of the semiconductor device after the SET process, and measurement of current and resistance characteristics of the semiconductor device after the RESET process.

The testing method may be performed on a number of measurement values for sampling. The first measurement value (e.g., K=1) begins at S610a. In order to measure the current after the SET process, the first power source 230a generates an operation signal (S620a). When the operation signal is applied to the first transmission line 110a, the pulse generator 210a generates a first SET pulse input signal (S630a). As described above, the first SET pulse input signal is transmitted to a semiconductor device (not shown) via the input probe pin 50 and the input pad 510 of the wafer 500 (S630a), where it is transformed into a first SET pulse output signal, and is transmitted to the oscilloscope 220a via the output pad 520 and the output probe pin 60. The oscilloscope 220a measures a first SET current based on the first SET pulse input signal and the first SET pulse output signal (S650a).

In order to measure the resistance after the SET process, the second power source 230b generates an operation signal (S660a). When the operation signal is applied to the second transmission line 110b, the SMU 210b generates a first SET DC input signal (e.g., a read voltage) (S670a). As described above, the first SET DC input signal is transmitted to the semiconductor device (not shown) via the input probe pin 50 and the input pad 510 of the wafer (S680a), where it is transformed into a first SET DC output signal and is transmitted to the ground connection 220b via the output pad 520 and the output probe pin 60. The SMU 210b measures a first SET resistance based on the first SET DC input signal and the first SET DC output signal (S700a).

In order to measure the current after the RESET process, the first power source 230a generates an operation signal (S610b). When the operation signal is applied to the first transmission line 110a, the pulse generator 210a generates a first RESET pulse input signal (S620b). As described above, the first RESET pulse input signal is transmitted to the semiconductor device (not shown) via the input probe pin 50 and the input pad 510 of the wafer (S630b), where it is transformed into a first RESET pulse output signal and is transmitted to the oscilloscope 220a via the output pad 520 and the output probe pin 60. The oscilloscope 220a measures a first RESET current based on the first RESET pulse input signal and the first RESET pulse output signal (S650b).

In order to measure the resistance after the RESET program, the second power source 230b generates an operation signal (S660b). When the operation signal is applied to the second transmission line 110b, the SMU 210b generates a first RESET DC input signal (e.g., a read voltage) (S670b). As described above, the first RESET DC input signal is transmitted to the semiconductor device (not shown) via the input probe pin 50 and the input pad 510 of the wafer (S680b), where it is transformed into a first RESET DC output signal and is transmitted to the ground connection 220b via the output pad 520 and the output probe pin 60. The SMU 210b measures a first RESET resistance based on the first RESET DC input signal and the first RESET DC output signal (S700b).

As described above, the first SET current, the first SET resistance, the first RESET current, and the first RESET resistance may be measured using the exemplary embodiment illustrated in FIG. 6. The steps described above with reference to FIG. 6 may be repeated to measure a second through $K_{th}$ SET current, SET resistance, RESET current and RESET resistance.

Figure 7:
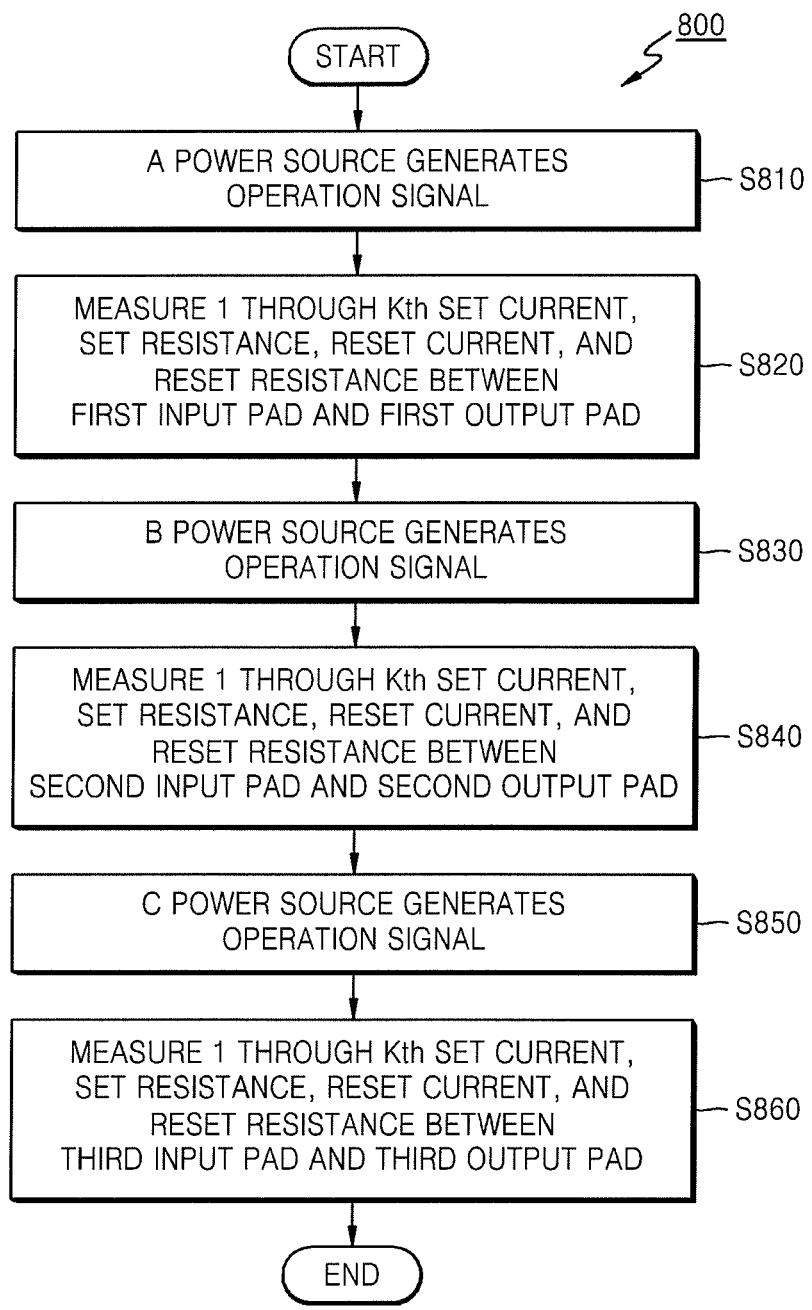
FIG. 7 is a flowchart of a method for testing a semiconductor device using a test apparatus including a probe card, according to another exemplary embodiment of the inventive concept.

FIG. 7 is a flowchart illustrating a method 800 for testing a semiconductor device using the test apparatus 2C including the probe card 1C illustrated in FIG. 3, according to another exemplary embodiment of the inventive concept.

Referring to FIGS. 3 and 7, the second power source controller 240b controls the A power source 235a, causing it to generate an operation signal (S810). The operation signal is applied to the A probe transmission line 115a, causing the first input probe MEMS switch 40a and the first output probe MEMS switch 70a to be simultaneously turned on. The first connection node 30 and the first input probe pin 50a, and the second connection node 80 and the first output probe pin 60a are electrically connected, respectively.

The current and resistance characteristics of a semiconductor device (not shown) connected between the first input pad 510a and the first output pad 520a are measured (S820). For example, the first power source 230a applies an operation signal to the first transmission line 110a, and the first through $K_{th}$ SET current and RESET current of the semiconductor device (not shown) between the first input pad 510a and the first output pad 520a may be measured using the pulse generator 210a and the oscilloscope 220a. The second power source 230b applies an operation signal to the second transmission line 110b, and the SET resistance and RESET resistance of the semiconductor device (not shown) between the first input pad 510a and the first output pad 520a may be measured using the SMU 210b.

The second power source controller 240b controls the B power source 235b, causing it to generate an operation signal (S830). The operation signal is applied to the B probe transmission line 115b, causing the second input probe MEMS switch 40b and the second output probe MEMS switch 70b to be simultaneously turned on. The first connection node 30 and the second input probe pin 50b, and the second connection node 80 and the second output probe pin 60b are electrically connected, respectively.

The current and resistance characteristics of a semiconductor device (not shown) connected the second input pad 510b and the second output pad 520b are measured (S840). For example, the first power source 230a applies an operation signal to the first transmission line 110a, and the first through $K_{th}$ SET current and RESET current of the semiconductor device (not shown) between the second input pad 510b and the second output pad 520b may be measured using the pulse generator 210a and the oscilloscope 220a. The second power source 230b applies an operation signal to the second transmission line 110b, and the SET resistance and RESET resistance of the semiconductor device (not shown) between the second input pad 510b and the second output pad 520b may be measured using the SMU 210b.

The second power source controller 240b controls the C power source 235c, causing it to generate an operation signal (S850). The operation signal is applied to the C probe transmission line 115c, causing the third input probe MEMS switch 40c and the third output probe MEMS switch 70c to be simultaneously turned on. The first connection node 30 and the third input probe pin 50c, and the second connection node 80 and the third output probe pin 60c are electrically connected, respectively.

The current and resistance characteristics of a semiconductor device (not shown) connected between the third input pad 510c and the third output pad 520c are measured (S860). For example, the first power source 230a applies an operation signal to the first transmission line 110a, and the first through $K_{th}$ SET current and RESET current of the semiconductor device (not shown) between the third input pad 510c and the third output pad 520c may be measured using the pulse generator 210a and the oscilloscope 220a. The second power source 230b applies an operation signal to the second transmission line 110b, and the SET resistance and RESET resistance of the semiconductor device (not shown) between the third input pad 510c and the third output pad 520c may be measured using the SMU 210b.

Figure 8:
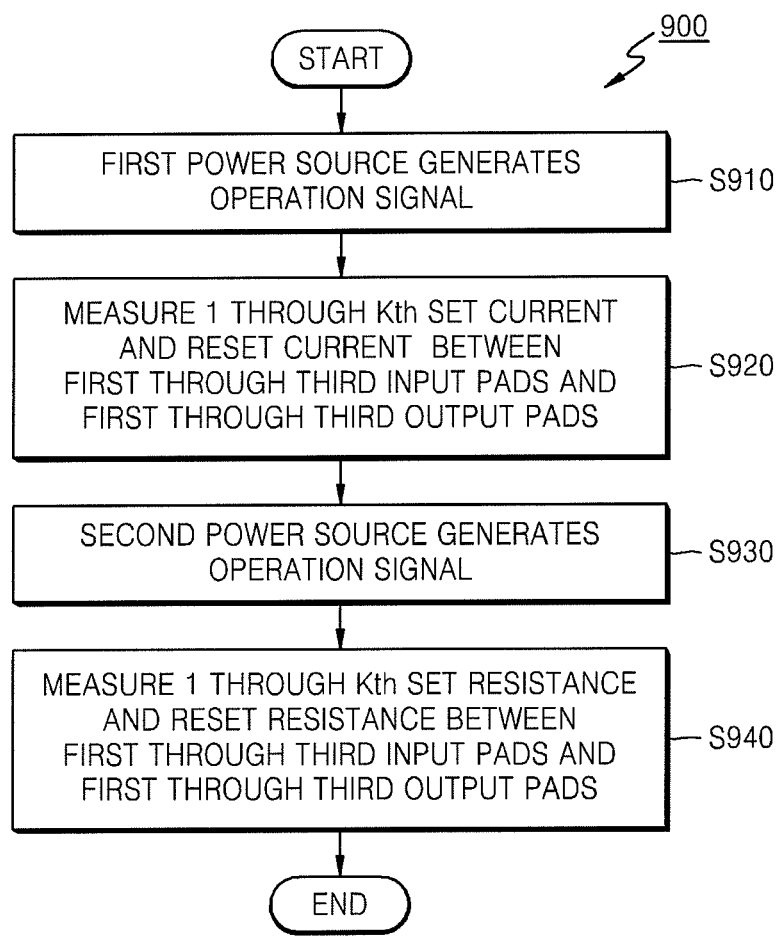
FIG. 8 is a flowchart of a method for testing a semiconductor device using a test apparatus including a probe card, according to another exemplary embodiment of the inventive concept.

FIG. 8 is a flowchart illustrating a method 900 for testing a semiconductor device using the test apparatus 2C including the probe card 1C illustrated in FIG. 3, according to another exemplary embodiment of the inventive concept.

Referring to FIGS. 3 and 8, the first power source controller 240a controls the first power source 230a, causing it to generate an operation signal (S910). The operation signal is applied to the first transmission line 110a, causing the first input terminal MEMS switch 20a and the first output terminal MEMS switch 90a to be simultaneously turned on. The first connection node 30 and the first input terminal 10a, and the second connection node 80 and the first output terminal 100a are electrically connected, respectively.

The current and resistance characteristics of semiconductor devices (not shown) connected between the first through third input pads 510a, 510b, and 510c, and the first through third output pads 520a, 520b, and 520c are measured (S920). For example, the A power source 235a applies an operation signal to the A probe transmission line 115a, and the first through $K_{th}$ SET current and RESET current of the semiconductor device (not shown) between the first input pad 510a and the first output pad 520a may be measured using the pulse generator 210a and the oscilloscope 220a. The B power source 235b applies an operation signal to the B probe transmission line 115b, and the first through $K_{th}$ SET current and RESET current of the semiconductor device (not shown) between the second input pad 510b and the second output pad 520b may be measured using the pulse generator 210a and the oscilloscope 220a. Similarly, the C power source 235c applies an_operation signal to the C probe transmission line 115c, and the first through $K_{th}$ SET current and RESET current of the semiconductor device (not shown) between the third input pad 510c and the third output pad 520c may be measured using the pulse generator 210a and the oscilloscope 220a.

The first power source controller 240a controls the second power source 230b, causing it to generate an operation signal (S930). The operation signal is applied to the second transmission line 110b, causing the second input terminal MEMS switch 20b and the second output terminal MEMS switch 90b to be simultaneously turned on. The first connection node 30 and the DC input terminal 10b, and the second connection node 80 and the DC output terminal 100b are electrically connected, respectively.

For example, the A power source 235a applies an operation signal to the A probe transmission line 115a, and the first through $K_{th}$ SET resistance and RESET resistance of the semiconductor device (not shown) between the first input pad 510a and the first output pad 520a may be measured using the SMU 210b. The B power source 235b applies an operation signal to the B probe transmission line 115b, and the first through $K_{th}$ SET resistance and RESET resistance of the semiconductor device (not shown) between the second input pad 510b and the second output pad 520b may be measured using the SMU 210b. Similarly, the C power source 235c applies an operation signal to the C probe transmission line 115c, and the first through $K_{th}$ SET resistance and RESET resistance of the semiconductor device (not shown) between the third input pad 510c and the third output pad 520c may be measured using the SMU 210b.

A separate probe pin may be connected to each of the semiconductor devices being tested, allowing a plurality of semiconductor devices to be sequentially tested via the probe MEMS switches connected to each of the probe pins, respectively. As a result, the SET resistance, the RESET resistance, the SET current, and the RESET current of each of a plurality of the semiconductor devices may be tested without changing the probe card.

Figure 9A:
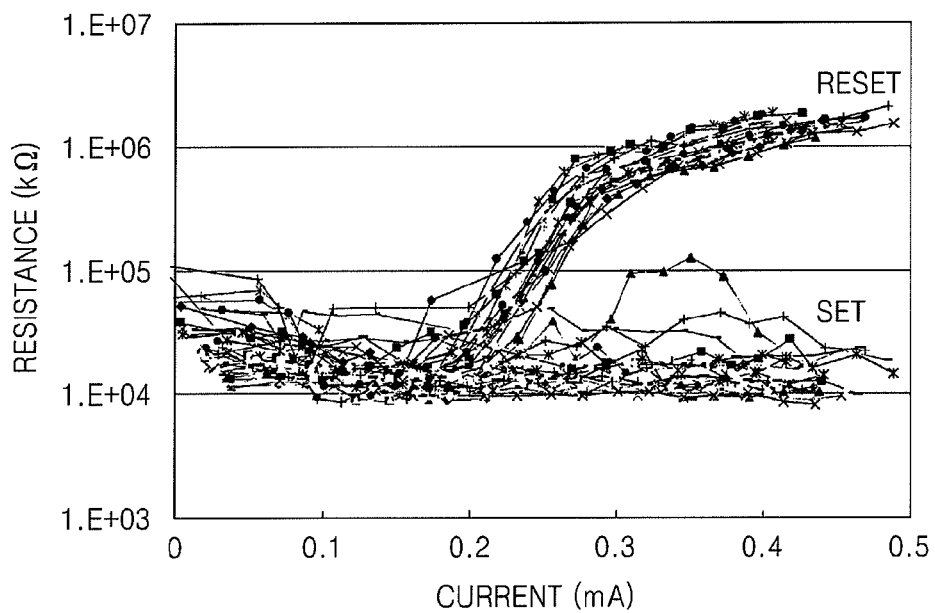
FIG. 9A is a graph illustrating a current-resistance characteristic of a semiconductor device measured using a conventional test apparatus.
Figure 9B:
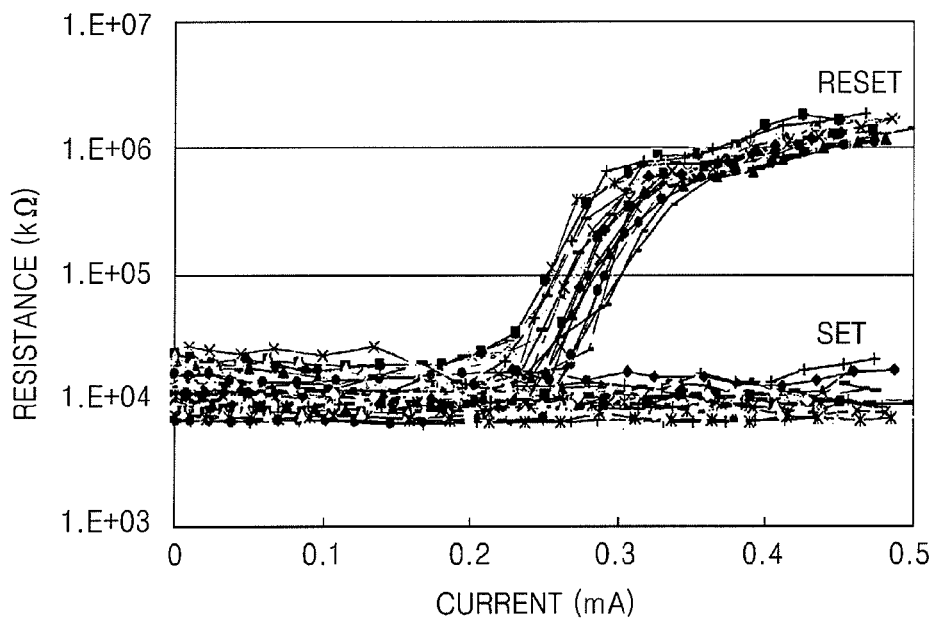
FIG. 9B is a graph illustrating a current-resistance characteristic of a semiconductor device measured using a test apparatus including a probe card according to an exemplary embodiment of the inventive concept.

FIG. 9A is a graph illustrating a current-resistance characteristic of a semiconductor device measured using a conventional test apparatus. FIG. 9B is a graph illustrating a current-resistance characteristic of a semiconductor device measured using a test apparatus including a probe card according to the one or more exemplary embodiments of the inventive concept.

Referring to FIGS. 9A and 9B, a first through $K_{th}$ SET resistance relative to a change of a SET current, and a first through $K_{th}$ SET resistance relative to a change of a RESET current are measured. Referring to FIG. 9A, a mechanical switch is used in a conventional test apparatus. In the conventional test apparatus, a distance between a pad and a probe pin is about 1 m, which requires a voltage equal to or greater than about 1.5 V to be generated when performing a switching operation. This voltage may cause damage to the semiconductor device, deteriorating measurement reliability. Referring to FIG. 9B, in a test apparatus according to the one or more exemplary embodiments of the inventive concept, the mechanical switch is replaced with a MEMS switch, and a distance between a pad and a probe pin is no greater than about 50 cm. As a result, a voltage no greater than about 0.5 V is generated when performing a switching operation and damage to the semiconductor device is prevented, improving measurement reliability.

Figure 10A:
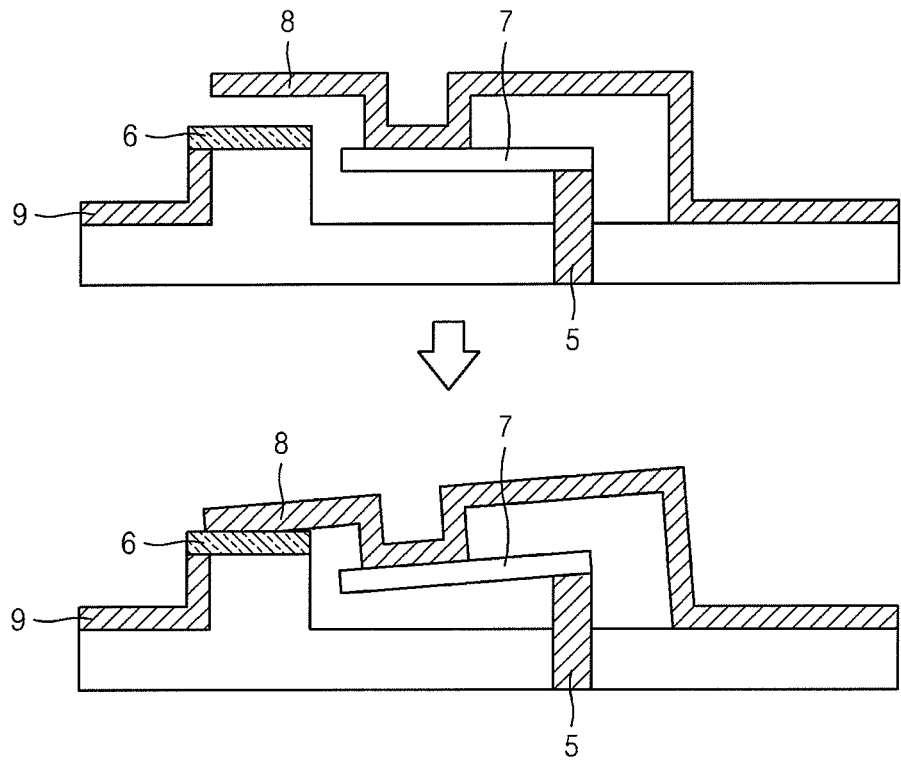
FIG. 10A is a diagram of a Microelectromechanical Systems (MEMS) switch in a probe card according to an exemplary embodiment of the inventive concept.
Figure 10B:
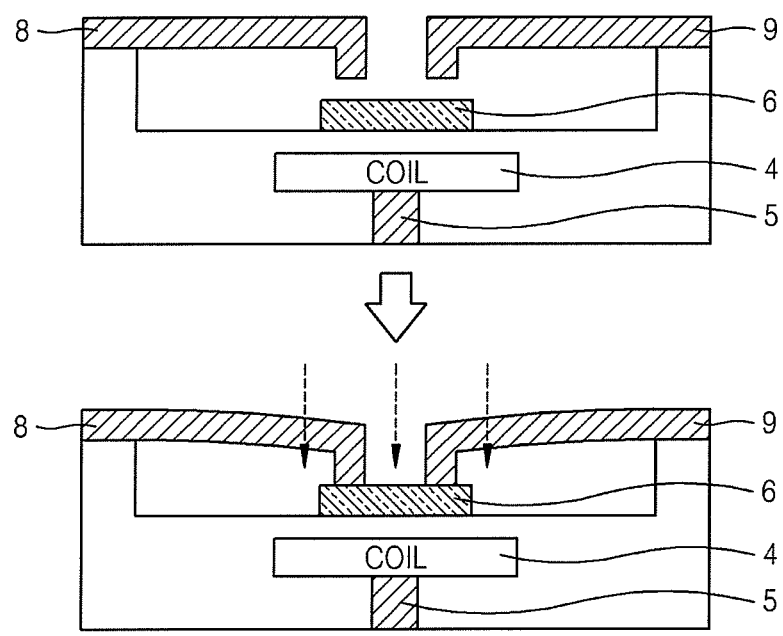
FIG. 10B is a diagram of a MEMS switch in a probe card according to an exemplary embodiment of the inventive concept.

FIGS. 10A and 10B are diagrams of MEMS switches in a probe card according to another exemplary embodiment of the inventive concept. In FIG. 10A, the MEMS switch comprises a piezoelectric element 7. In FIG. 10B, the MEMS switch comprises a coil 4.

Referring to FIGS. 10A and 10B, each of the MEMS switches may include a control portion 5 for receiving an operation signal, and a connection portion 6 for electrically connecting a first terminal 8 and a second terminal 9.

In FIG. 10A, when the operation signal is applied to the control portion 5 of the MEMS switch, a change in the physical properties of the piezoelectric element 7 causes the piezoelectric element 7 to bend downward. As a result, the first terminal 8 is bent downward, and is electrically connected to the connection portion 6, as illustrated in FIG. 1 OA.

In FIG. 10B, when the operation signal is applied to the control portion 5 of the MEMS switch, the coil 4 connected to the control portion 5 generates a magnetic force. As a result of the magnetic force, the first terminal 8 and the second terminal 9 are bent downward and are electrically connected to the connection portion 6.

While the inventive concept has been particularly shown and described with reference to exemplary embodiments hereinabove, it will be understood that the inventive concept is not limited to these embodiments, but may be modified by those skilled in the art without departing from the spirit and scope of the inventive concept, as defined by the following claims.

What is claimed is:

1. A probe card comprising:
a first input terminal Microelectromechanical Systems (MEMS) switch that connects a first input terminal and a first input probe pin, wherein the first input terminal MEMS switch comprises a control portion that receives an operation signal and a connection portion that connects the first input terminal and the first input probe pin;
a first output terminal MEMS switch that connects a first output terminal and a first output probe pin, wherein the first output terminal MEMS switch comprises a control portion that receives the operation signal and a connection portion that connects the first output terminal and the first output probe pin;
a first input probe MEMS switch that connects the first input terminal MEMS switch and the first input probe pin; and
a first output probe MEMS switch that connects the first output terminal MEMS switch and the first output probe pin.

2. The probe card of claim 1, wherein a distance between the first input probe pin and the first input terminal MEMS switch and a distance between the first output probe pin and the first output terminal MEMS switch is no greater than about 50 cm.

3. The probe card of claim 1, wherein the control portion of the first input terminal MEMS switch and the control portion of the first output terminal MEMS switch are configured to receive a same operation signal.

4. A probe card comprising:
a first input terminal Microelectromechanical Systems (MEMS) switch that connects a first input terminal and a first input probe pin, wherein the first input terminal MEMS switch comprises a control portion that receives an operation signal and a connection portion that connects the first input terminal and the first input probe pin;
a first output terminal MEMS switch that connects a first output terminal and a first output probe pin, wherein the first output terminal MEMS switch comprises a control portion that receives the operation signal and a connection portion that connects the first output terminal and the first output probe pin;
a second input terminal MEMS switch that connects a second input terminal and a second input probe pin, wherein the second input terminal MEMS switch comprises a control portion that receives the operation signal and a connection portion that connects the second input terminal and the second input probe pin; and
a second output terminal MEMS switch that connects a second output terminal and a second output probe pin, wherein the second output terminal MEMS switch comprises a control portion that receives the operation signal and a connection portion that connects the second output terminal and the second output probe pin, wherein
the first input terminal is a pulse input terminal that receives a pulse input signal,
the second input terminal is a direct current (DC) input terminal that receives a DC input signal,
the first output terminal is a pulse output terminal that transmits a pulse output signal, and
the second output terminal is a DC output terminal that transmits a DC output signal.

5. The probe card of claim 4, further comprising:
a first transmission line that connects the control portion of the first input terminal MEMS switch and the control portion of the first output terminal MEMS switch; and
a second transmission line that connects the control portion of the second input terminal MEMS switch and the control portion of the second output terminal MEMS switch, wherein
an operation signal transmitted via the first and second transmission lines performs one of,
simultaneously turning on the first input and output terminal MEMS switches and turning off the second input and output terminal MEMS switches, or
simultaneously turning on the second input and output terminal MEMS switches and turning off the first input and output terminal MEMS switches.

6. The probe card of claim 5, further comprising a power source switch, connected to the first and second transmission lines, that transmits the operation signal to one of the first or second transmission lines.

7. The probe card of claim 6, wherein the power source switch comprises a demultiplexer that transmits the operation signal to one of the first or second transmission lines according to a clock signal.

8. A probe card comprising:
a plurality of input terminals configured to receive a plurality of input signals;
a plurality of input probe pins configured to transmit the plurality of input signals to a plurality of input pads of a wafer; and
a plurality of input terminal Microelectromechanical Systems (MEMS) switches that connect the plurality of input terminals and a plurality of input probe MEMS switches, wherein,
each of the plurality of input terminal MEMS switches comprises a control portion that receives an operation signal and a connection portion that connects the plurality of input terminals and the plurality of input probe MEMS switches, and
each of the plurality of input probe MEMS switches comprises a control portion that receives the operation signal and a connection portion that connects the plurality of input terminal MEMS switches and the plurality input probe pins.

9. The probe card of claim 8, further comprising:
a plurality of output terminals configured to transmit a plurality of output signals;
a plurality of output probe pins configured to receive the plurality of output signals from a plurality of output pads of the wafer; and
a plurality of output terminal MEMS switches that connect the plurality of output terminals and the plurality of output probe pins, wherein
each of the plurality of output terminal MEMS switches comprises a control portion that receives the operation signal and a connection portion that connects the plurality of output terminals and the plurality of output probe pins.

10. The probe card of claim 9, further comprising a plurality of transmission lines configured to connect each control portion of the plurality of input terminal MEMS switches and each control portion of the plurality of output terminal MEMS switches,
wherein each of the plurality of transmission lines simultaneously transmits the operation signal to each control portion of the plurality of input terminal MEMS switches and each control portion of the plurality of output terminal MEMS switches.

11. The probe card of claim 8, further comprising:
a plurality of output terminals configured to transmit a plurality of output signals;
a plurality of output probe pins configured to receive the plurality of output signals from a plurality of output pads of the wafer; and
a plurality of output terminal MEMS switches that connect the plurality of output terminals and a plurality of output probe MEMS switches, wherein
each of the plurality of output terminal MEMS switches comprises a control portion that receives an operation signal and a connection portion that connects the plurality of output terminals and the plurality of output probe MEMS switches, and
each of the plurality of output probe MEMS switches comprises a control portion that receives an operation signal and a connection portion that connects the plurality of output terminal MEMS switches and the plurality of output probe pins.

12. The probe card of claim 11, further comprising a plurality of probe transmission lines configured to connect each control portion of the plurality of input probe MEMS switches and each control portion of the plurality of output probe MEMS switches,
wherein each of the plurality of probe transmission lines simultaneously transmits the operation signal to each control portion of the plurality of input probe MEMS switches and each control portion of the plurality of output probe MEMS switches.

13. The probe card of claim 12, further comprising a plurality of transmission lines configured to connect each control portion of the plurality of input terminal MEMS switches and each control portion of the plurality of output terminal MEMS switches,
wherein each of the plurality of transmission lines simultaneously transmits an operation signal to each control portion of the plurality of input terminal MEMS switches and each control portion of the plurality of output terminal MEMS switches.

14. A test apparatus comprising:
a probe card, wherein the probe card comprises:
a first input terminal Microelectromechanical Systems (MEMS) switch that connects a first input terminal and a first input probe pin,
a first output terminal MEMS switch that connects a first output terminal and a first output probe pin,
a second input terminal MEMS switch that connects a second input terminal and a second input probe pin, and
a second output terminal MEMS switch that connects a second output terminal and a second output probe pin;
a pulse generator configured to apply a pulse input signal to the first input terminal;
a source measuring unit (SMU) configured to apply a direct current (DC) input signal to the second input terminal;
an oscilloscope configured to receive a pulse output signal from the first output terminal; and
a ground connection configured to receive a DC output signal from the second output terminal.

15. A test apparatus comprising:
a probe card, wherein the probe card comprises:
a first input terminal Microelectromechanical Systems (MEMS) switch that connects a first input terminal and a first input probe pin,
a first output terminal MEMS switch that connects a first output terminal and a first output probe pin,
a second input terminal MEMS switch that connects a second input terminal and a second input probe pin, and
a second output terminal MEMS switch that connects a second output terminal and a second output probe pin;
a first power source configured to simultaneously apply a first operation signal to a control portion of the first input terminal MEMS switch and a control portion of the first output terminal MEMS switch;
a second power source configured to simultaneously apply a second operation signal to a control portion of the second input terminal MEMS switch and a control portion of the second output terminal MEMS switch; and
a power source controller configured to control the first and second power sources, wherein the first input and output terminal MEMS switches are turned on while the second input and output terminal MEMS switches are off, and the second input and output terminal MEMS switches are turned on while the first input and output terminal MEMS switches are off.

* * * * *